United States Patent [19]
Ishida et al.

[11] Patent Number: 5,827,623
[45] Date of Patent: Oct. 27, 1998

[54] OPTICAL PROXIMITY CORRECTION HALFTONE TYPE PHASE SHIFT PHOTOMASK

[75] Inventors: Shinji Ishida; Tadao Yasuzato, both of Tokyo, Japan

[73] Assignee: NEC Corporation, Tokyo, Japan

[21] Appl. No.: 741,016

[22] Filed: Oct. 30, 1996

[30] Foreign Application Priority Data

Oct. 31, 1995 [JP] Japan .................................... 7-308358

[51] Int. Cl.⁶ .......................................................... G06F 9/00
[52] U.S. Cl. .................................................................. 430/5
[58] Field of Search ................................ 430/5, 311, 312, 430/322

[56] References Cited

U.S. PATENT DOCUMENTS 5,429,896  7/1995  Hashida et al. .............................. 430/5

FOREIGN PATENT DOCUMENTS

| 2-211451 | 8/1990 | Japan . |
| 3-125150 | 5/1991 | Japan . |
| 3191347 | 8/1991 | Japan . |
| 4136854 | 5/1992 | Japan . |
| 6282063 | 10/1994 | Japan . |
| 0829255 A | 11/1996 | Japan . |

OTHER PUBLICATIONS

K. Hashimoto et al.; "The Application of Deep UV Phase Shifted–Single Layer Halftone Reticles to 256 Mbit Dynamic Random Access Memory Cell Patterns"; Jpn. J. Appl. Phys., vol. 33, (1994) pp. 6823–6830.

R. Pforr et al.; "Feature biasing versus feature–assisted lithography—a comparison of proximity correction methods for 0.5*(λ/NA) lithography"; SPIE, vol. 2440, pp. 150–170.

J. Garofalo et al.; "Reduction of ASIC Gate–level line–end shortening by Mask Compensation"; SPIE, vol. 2440, pp. 171–183.

O. Otto et al., "Integrating proximity effects corrections with photomask data preparation"; SPIE, vol. 2440, pp. 184–191.

J. Garofalo et al.; Automated Layout of Mask Assist–features for Realizing $0.5k_1$ ASIC Lithography; SPIE, vol. 2440, pp. 302–2440.

W. Han et al.; "Optical proximity correction using a Transmittance Controlled Mask (TCM)"; SPIE, vol. 2440, pp. 494–505.

T. Yasuzato et al.; "Improvement of resist pattern fidelity with partial attenuated phase shift mask"; Paper 2726–53, SPIE's 1996 International Symposium on Microlithography, Mar. 10–15, 1996, Santa Clara, CA.; p. 255.

*Primary Examiner*—S. Rosasco
*Attorney, Agent, or Firm*—Whitham, Curtis & Witham

[57] ABSTRACT

In a halftone type phase shift photomask, a patterned halftone layer is formed on a transparent substrate, and a light screen layer is formed on the halftone layer. A part of a mask pattern is changed from opaque to halftone, thus improving the resist pattern fidelity.

12 Claims, 17 Drawing Sheets

Fig. 1A
PRIOR ART
Fig. 1B
PRIOR ART
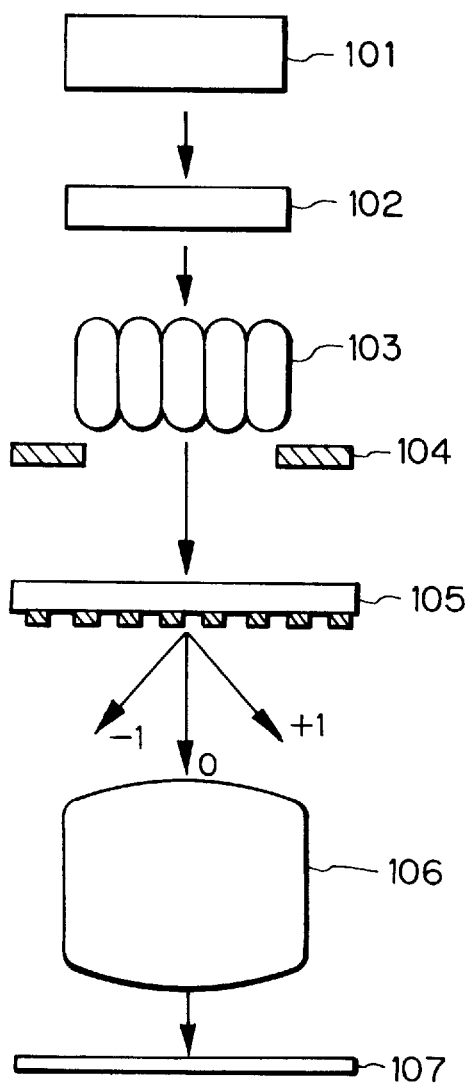
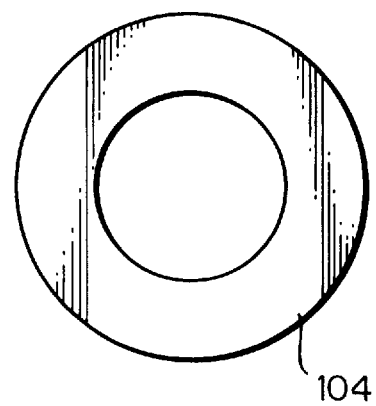

Fig. 2A
PRIOR ART
Fig. 2B
PRIOR ART
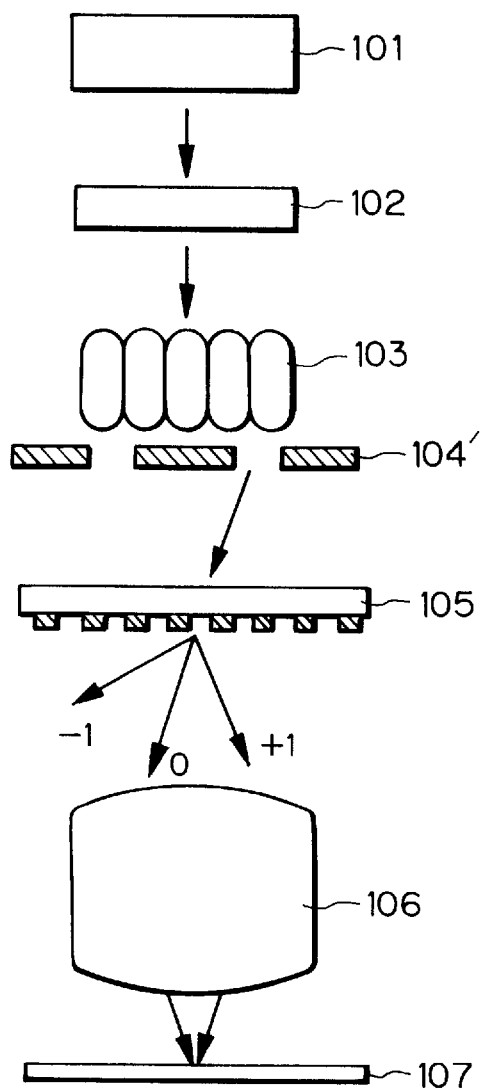
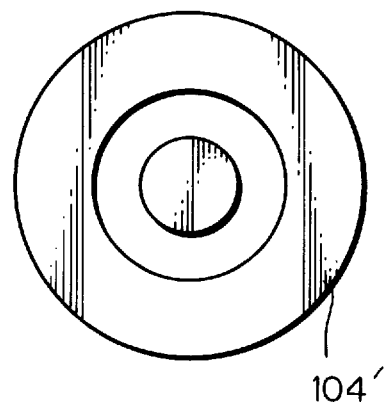

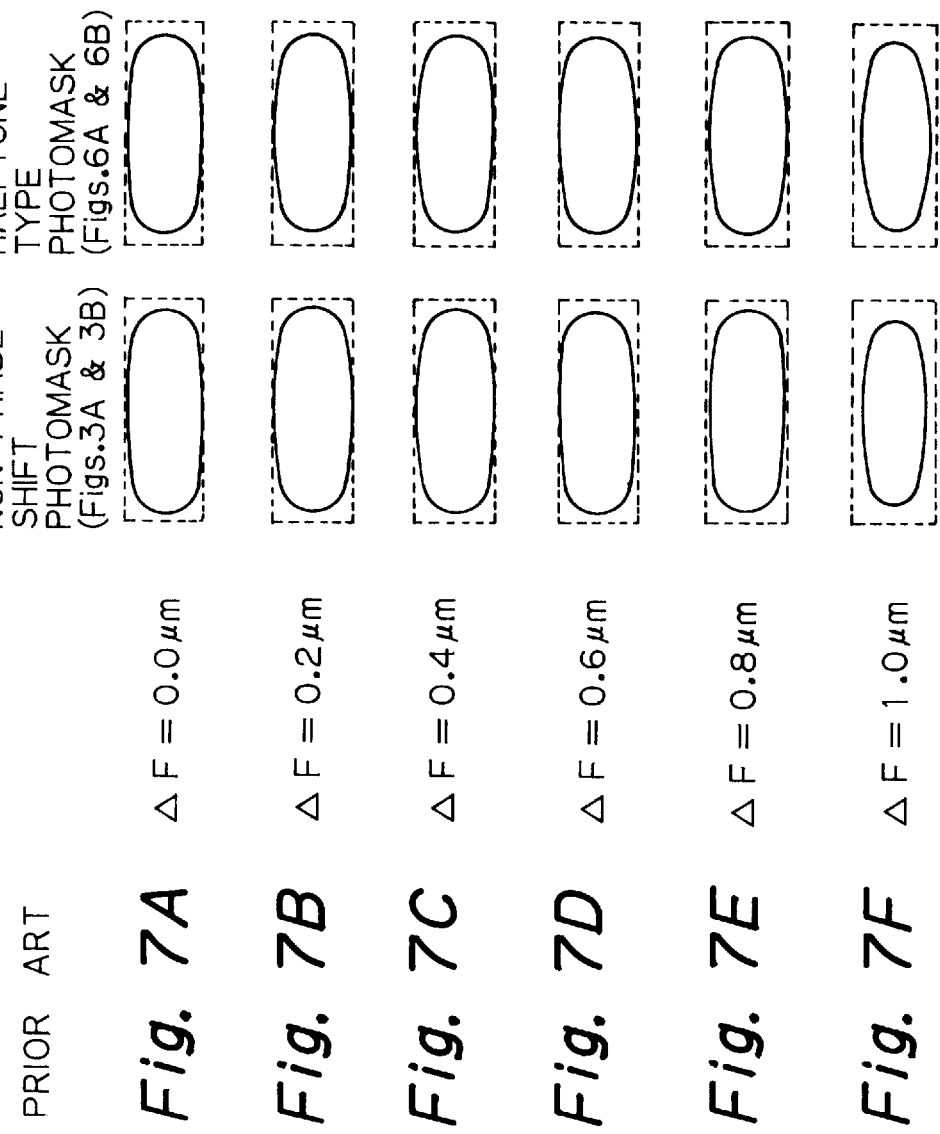

Fig. 9A
PRIOR ART
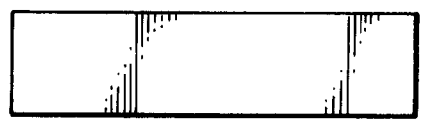
Fig. 9B
PRIOR ART
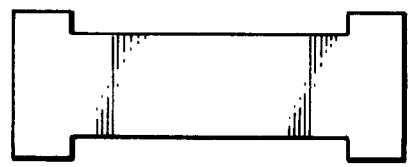
Fig. 9C
PRIOR ART
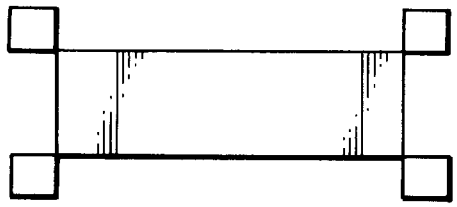
Fig. 9D
PRIOR ART

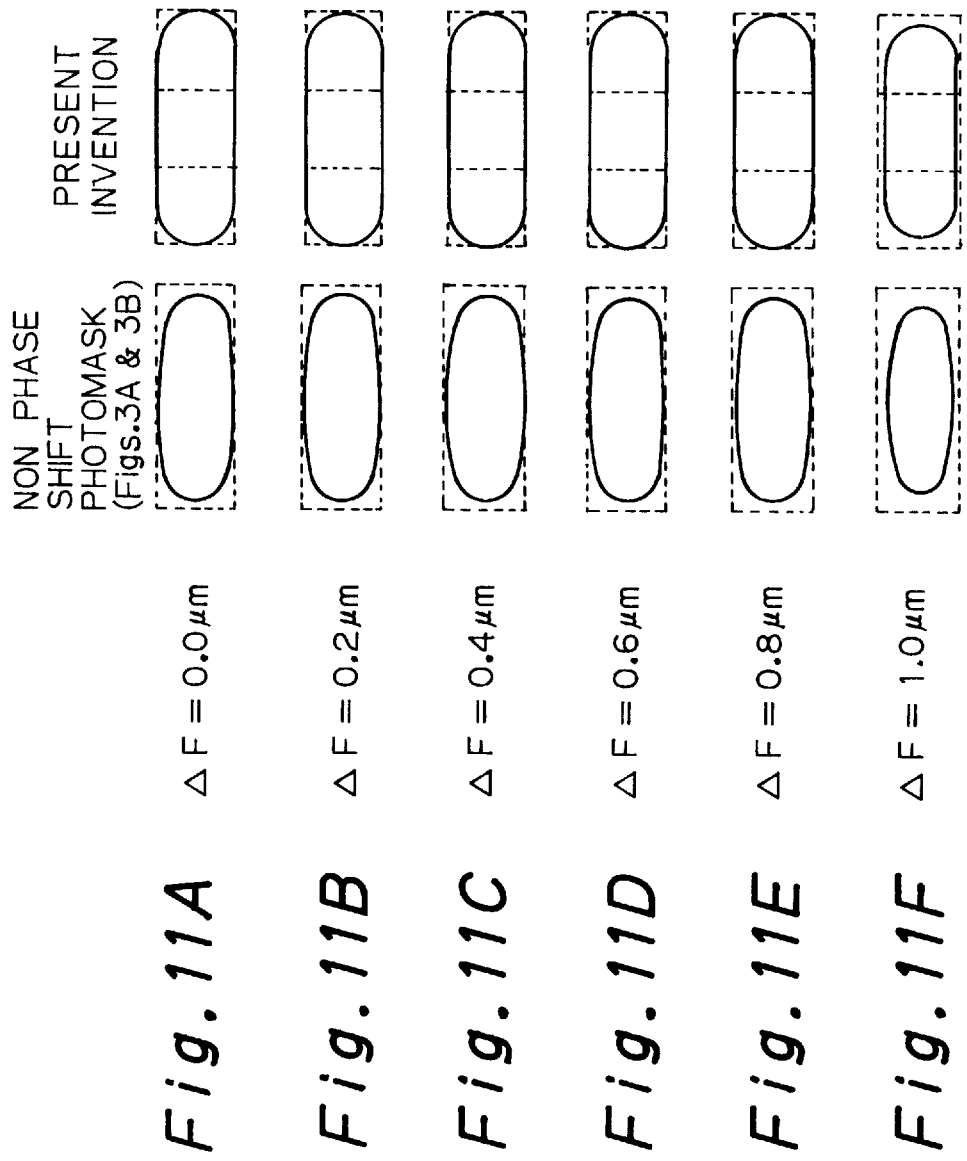

OPTICAL PROXIMITY CORRECTION HALFTONE TYPE PHASE SHIFT PHOTOMASK

BACKGROUND OF THE INVENTION

1. Field of the Invention

The presesnt invention relates to a halftone type phase shift photomask.

2. Description of the Related Art

Generally, in semiconductor manufacturing processes, photolithography technology by photomasks has been used. Note that a special photomask having a reduction ratio of 1 is called a reticle, however, assume here that such a reticle is also called a photomask.

In the photolithography technology, a limit resolution R for representing a dimension of a minimum pattern is represented by the Rayleigh formula:

$$R = K_1 \cdot \lambda / NA$$

where $K_1$ is a constant depending upon the photolithography process;

$\lambda$ is a wavelength of light; and

NA is a numeral aperture of an exposure system.

Therefore, the higher NA, the higher R.

On the other hand, a depth-of-focus (DOF) is represented by $$DOF = K_2 \cdot \lambda / NA^2$$

where $K_2$ is a constant depending upon the photolithography process.

Therefore, the higher NA, the smaller DOF.

Thus, the limit resolution R cannot be reduced by enlarging NA.

In order to reduce the limit resolution without changing NA, various super resolution techniques have been developed. One is to improve illumination systems to control the transmittance of light, and another is to improve photomasks to control the transmittance and phase of light. Still another is to improve irises on projection lenses to control the transmittance and phase of light.

The illumination methods will be explained later in detail.

Also, there are improved photomasks called phase shift photomasks, or Shibuya-Levenson systems. The phase shift photomasks are mainly divided into an auxiliary pattern type, a rim type and a halftone (attenuated) type, which will be explained later in detail.

The auxiliary pattern type phase shift photomask and the rim type phase shift photomask are complicated compared with the halftone type phase shift photomask. That is, it is difficult to manufacture and inspect the auxiliary pattern type phase shift photomask and the rim type phase shift photomask, which increases the manufacturing cost. In view of this shortcoming, the halftone type phase shift photomask is advantageous over the auxiliary pattern type phase shift photomask and the rim type phase shift photomask. In addition, the halftone type phase shift photomask is excellent in view of DOF as compared with the non phase shift photomask.

In the halftone type phase shift photomasks, however, the longitudinal length of an obtained photoresist pattern is reduced due to the optical proximity effect. This is disadvantageous compared with the non phase shift photomask.

On the other hand, in order to diminish the optical proximity effect, optical proximity correction (OPC) photomasks have been developed, which will be explained later in detail. In the OPC photomasks, however, the patterns are complex, which increases manufacturing cost.

SUMMARY OF THE INVENTION

It is an object of the present invention to provide an improved halftone type phase shift photomask having an OPC function.

According to the present invention, in a halftone type phase shift photomask, a patterned halftone layer is formed on a transparent substrate, and a light screen layer is formed on the halftone layer. That is, a part of a mask pattern is changed from opaque to halftone, thus improving the resist pattern fidelity.

BRIEF DESCRIPTION OF THE DRAWINGS

The present invention will be more clearly understood from the description as set forth below, as compared with the prior art, with reference to the accompanying drawings, wherein:

FIG. 1A is a diagram illustrating a prior art photolithography apparatus for explaining a first conventional illumination method;

FIG. 1B is a plan view of the iris of FIG. 1A;

FIG. 2A is a diagram illustrating another prior art photolithography apparatus for explaining a second conventional illumination method;

FIG. 2B is a plan view of the iris of FIG. 2A;

FIGS. 7A through 7F are pattern diagrams of photoresist layers obtained by the prior art halftone type photomask of FIGS. 6A and 6B

FIGS. 9A through 9D are pattern diagrams of OPC photomasks;

FIGS. 11A through 11F are pattern diagrams of photoresist layers obtained by the OPC halftone type photomask of FIGS. 10A and 10B;

DESCRIPTION OF THE PREFERRED EMBODIMENT

Figure 3A:
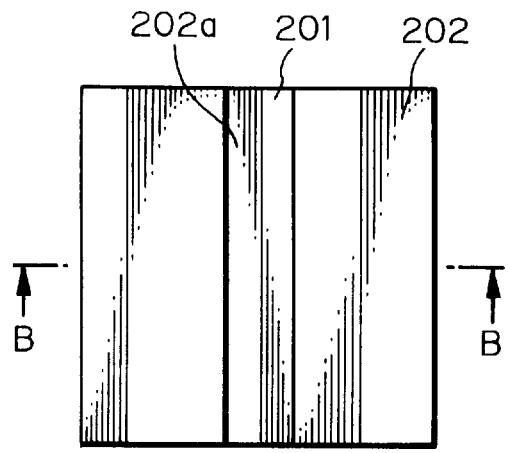
FIG. 3A is a plan view illustrating a prior art photomask.

Before the description of the preferred embodiment prior art illumination methods, prior art photomasks, and prior art optical proximity correction methods will be explained with reference to FIGS. 1A, 1B, 2A, 2B, 3A through 3D, 4A through 4D, 5A through 5D, 6A through 6D, 7A, 7B, 8A through 8E and 9A through 9D.

In FIG. 1A, which illustrates a prior art photolithography apparatus for explaining a first conventional illumination method, reference numeral 101 designates a mercury lamp which generates a light beam. The light beam is transmitted via a cold mirror (not shown) to an inteference filter 102, so that the light beam is converted into a monochromatic light beam. The monochromatic light beam is incident to a fly-eye lens 103 formed by a plurality of parallel lens units. As a result, the monochromatic light beam is made uniform through the fly-eye lens 103. Then, the monochromatic light beam passes through an apertured circular iris 104 as illustrated in FIG. 1B and reaches a photomask 105. Then, the monochromatic light beam passed through the photomask 105 is projected by a projection lens 106 onto a semiconductor wafer 107.

In FIG. 1A, the mercury lamp 101 is called a primary light source, and the fly-eye lens 103 is called a secondary light source. Also, in this case, the illumination state of the photomask 105 is mainly dependent upon the fly-eye lens 103, not upon the mercury lamp 101.

In the photolithography apparatus as illustrated in FIGS. 1A and 1B, however, a zeroth order light (transmission light) component as well as ±1st order diffraction light components is incident from the photomask 105 to the projection lens 106 and the semiconductor wafer 107. In this case, when the pattern of the photomask 105 is more-fined, the zeroth order light component more than the ±1st order diffraction light components is incident to the projection lens 106 and the semiconductor wafer 107. Note that the zeroth order light component does not contribute to resolution or to DOF.

In FIG. 2A, which illustrates another prior art photolithography apparatus for explaining a second conventional illumination method, a ring-shaped iris 104' as illustrated in FIG. 2B is provided instead of the apertured circular iris 104 of FIGS. 1A and 1B. As a result, the +1st or −1st order diffraction light component rather than the zeroth order light component is incident from the photomask 105 to the projection lens 106 and the semiconductor wafer 107. Thus, since the zeroth order light component incident to the projection lens 106 and the semiconductor wafer 107 is diminished to contribute to higher resolution and larger DOF.

Figure 3B:
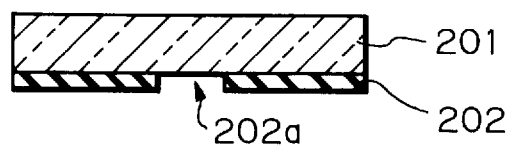
FIG. 3B is a cross-sectional view taken along the line B—B of FIG. 3A.
Figure 3C:
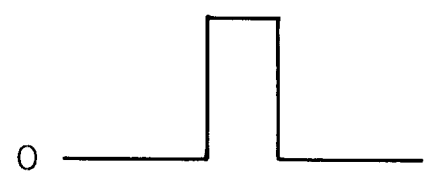
FIG. 3C is a graph showing light intensity characteristics of the light pattern passed through the photomask of FIGS. 3A and 3B.
Figure 3D:
FIG. 3D is a graph showing light intensity characteristics of an image pattern obtained by the photomask of FIGS. 3A and 3B.

FIG. 3A is a plan view illustrating a prior art photomask, and FIG. 3B is a cross-sectional view taken along the line B—B of FIG. 3A. That is, reference numeral 201 designates a transparent substrate on which an about 70 to 100 nm thick light screen layer 202 made of Cr and Cro is formed. Also, an aperture 202a is perforated in the light screen layer 202. Therefore, the amplitude of light passing through the photomask of FIGS. 3A and 3B is definite within the aperture 202a and is zero outside of the aperture 202a. Thus, the light passed through the photomask of FIGS. 3A and 313 shows rectangular characteristics as shown in FIG. 3C. On the other hand, the light pattern at the photomask of FIGS. 3A and 3B is generally represented by Fourier transformation, and is transformed at the projection lens 106 (see FIGS. 1A and 2A) by reverse Fourier transformation, thus obtaining the light pattern of the photomask of FIGS. 3A and 3B at the semiconductor wafer 107 (see FIGS. 1A and 1B). In this case, however, since the projection lens 106 serves as a low-pass filter, the high frequency components are removed from the light pattern at the semiconductor wafer 107. As a result, as shown in FIG. 3D, a light intensity of the light pattern at the semiconductor wafer 107, which is represented by a square value of the amplitude of the light component, loses the rectangular characteristics of FIG. 3C.

Figure 4A:
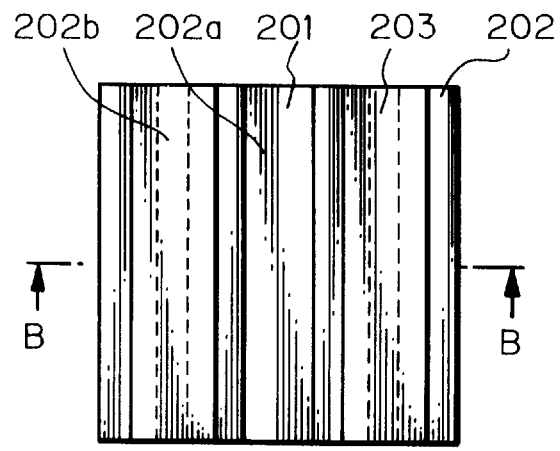
FIG. 4A is a plan view illustrating a prior art auxiliary pattern type phase shift photomask.
Figure 4B:
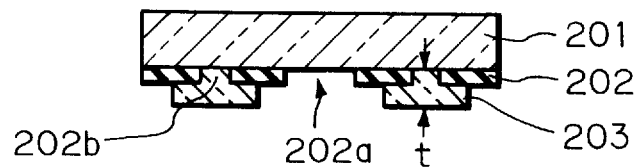
FIG. 4B is a cross-sectional view taken along the line B—B of FIG. 4A.

FIG. 4A is a plan view illustrating a prior art auxiliary pattern type phase shift photomask and FIG. 4B is a cross-sectional view taken along the line B—B of FIG. 4A. In FIGS. 4A and 4B, apertures 202b are provided on both sides of the aperture 201a in the light screen layer 202 of FIGS. 3A and 3B, and a transparent layer 203 made of $SiO_2$ or the like is provided on the apertures 202b. In this case, the aperture 202a has a width larger than a critical resolution value, while the apertures 202b have a width smaller than the critical resolution value. Also, the thickness t of the transparent layer 203 satisfies the following:

$$t=(\lambda/2)/(n_1-n_0) \qquad (1)$$

where $\lambda$ is a wavelength of the light passing through the photomask of FIGS. 4A and 4B;

$n_1$ is a refractive index of the transparent layer 203; and $n_0$ is a refractive index of the air ($n_0=1$).

Figure 4C:
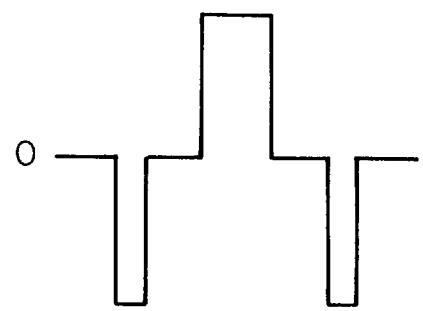
FIG. 4C is a graph showing light intensity characteristics of the light pattern passed through the photomask of FIGS. 4A and 4B.

Therefore, the difference in phase between the aperture 202a and the apertures 202b is 180°, and therefore, the transparent layer 203 is called a phase shifter. Thus, as shown in FIG. 4C, the amplitude of light passing through the photomask of FIGS. 4A and 4B is definite within the apertures 202a and 202b and is zero outside of the apertures 202a and 202b. In this case, the amplitude of light passing through the aperture 202a is opposite to the amplitude of light passing through the apertures 202b in terms of phase. Therefore, the light passed through the photomask of FIGS. 4A and 4B has rectangular characteristics with additional sub rectangles as shown in FIG. 4C. Note that the amplitude of FIG. 4C is shown in terms of phase. On the other hand, the light pattern at the photomask of FIGS. 4A and 4B is also generally represented by Fourier transformation, and is transformed at the projection lens 106 (see FIGS. 1A and 2A) by reverse Fourier transformation, thus obtaining the light pattern of the photomask of FIGS. 4A and 4B at the semiconductor wafer 107 (see FIGS. 1A and 1B). In this case, since the projection lens 106 also serves as a low-pass filter, the high frequency components are removed from the light pattern at the semiconductor wafer 107. As a result, as shown in FIG. 4D, the light intensity of the light pattern at the semiconductor wafer 107 loses the rectangular characteristics of FIG. 4C.

Figure 4D:
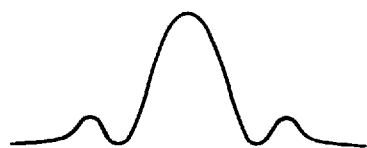
FIG. 4D is a graph showing light intensity characteristics of an image pattern obtained by the photomask of FIGS. 4A and 4B.

The light intensity characteristics as shown in FIG. 4D are sharp compared with those as shown in FIG. 3D. Therefore, the auxiliary pattern type phase shift photomask of FIGS. 4A and 4B contributes to higher resolution and larger DOF.

Figure 5A:
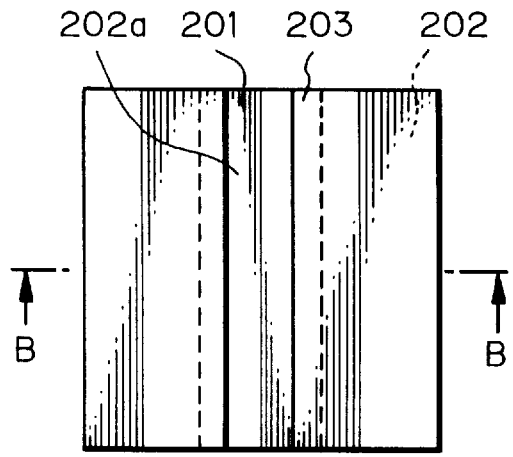
FIG. 5A is a plan view illustrating a prior art rim type phase shift photomask.
Figure 5B:
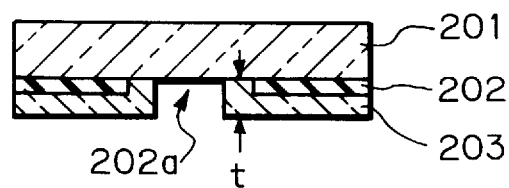
FIG. 5B is a cross-sectional view taken along the line B—B of FIG. 5A.

FIG. 5A is a plan view illustrating a prior art rim type phase shift photomask and FIG. 4B is a cross-sectional view taken along the line B—B of FIG. 5A (see: JP-A-3-191347). In FIGS. 5A and 5B, a transparent layer (phase shifter) 203 made of SiO$_2$ or the like is provided on the aperture 202a as well as on the light screen layer 202. In this case, the thickness t of the transparent layer 203 at the aperture 202a satisfies the following:

$$t=(\lambda/2)/(n_1-n_0) \tag{2}$$

where $\lambda$ is a wavelength of the light passing through the photomask of FIGS. 5A and 5B:

$n_1$ is a refractive index of the transparent layer 203; and $n_0$ is a refractive index of the air ($n_0=1$).

Figure 5C:
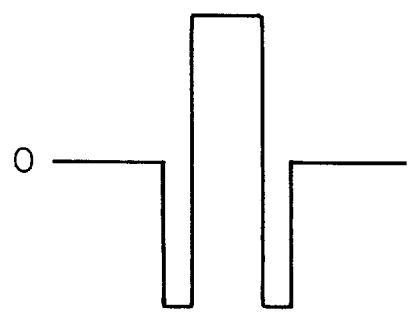
FIG. 5C is a graph showing light intensity characteristics of the light pattern passed through the photomask of FIGS. 5A and 5B.

Therefore, the difference in phase between a center portion and peripheral portions of the aperture 202a is 180°. Thus, as shown in FIG. 5C, the amplitude of light passing through the photomask of FIGS. 5A and 5B is definite within the aperture 202a and is zero outside of the aperture 202a. In this case, the amplitude of light passing through the center portion of the aperture 202a is opposite to the amplitude of light passing through the peripheral portions of the aperture 202a in terms of phase. Therefore, the light passed through the photomask of FIGS. 5A and 5B has rectangular characteristics with additional sub rectangles as shown in FIG. 5C. As a result, as shown in FIG. 5D, the light intensity of the light pattern at the semiconductor wafer 107 loses the rectangular characteristics of FIG. 5C.

Figure 5D:
FIG. 5D is a graph showing light intensity characteristics of an image pattern by the photomask of FIGS. 5A and 5B.

The light intensity characteristics as shown in FIG. 5D are also sharp compared with those as shown in FIG. 3D. Therefore, the rim type phase shift photomask of FIGS. 5A and 5B contributes to higher resolution and larger DOF.

Figure 6A:
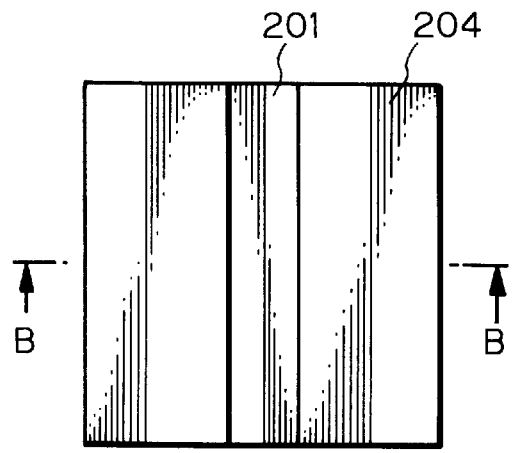
FIG. 6A is a plan view illustrating a prior art halftone (attennated) type phase shift photomask.
Figure 6B:
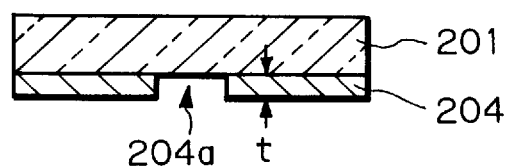
FIG. 6B is a cross-sectional view taken along the line B—B of FIG. 6A.

FIG. 6A is a plan view illustrating a prior art phase shift halftone (attenuated) type photomask, and FIG. 6B is a cross-sectional view taken along the line B—B of FIG. 6A (see: JP-A-4-136854). In FIGS. 6A and 6B, an halftone layer 204 made of chrome nitride oxide or the like is provided instead of the light screen layer 202 of FIGS. 3A and 3B. In this case, the transmittance of the halftone layer 204 is generally about 3 to 15 percent, and an aperture 204a is perforated in the halftone layer 204. Also, the thickness t of the halftone layer 204 satisfies the following:

$$t=(\lambda/2)/(n_2-n_0) \tag{3}$$

where $\lambda$ is a wavelength of the light passing through the photomask of FIGS. 6A and 6B:

$n_2$ is a refractive index of the halftone layer 204; and $n_0$ is a refractive index of the air ($n_0=1$).

Figure 6C:
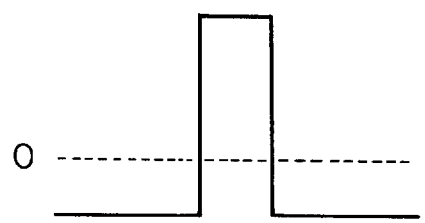
FIG. 6C is a graph showing light intensity characteristics of the light pattern passed through the photomask of FIGS. 6A and 6B.

Therefore, the difference in phase between the halftone layer 204 and the apertures 204a is 180°, and therefore, the halftone layer 204 is also called a halftone phase shifter. Thus, as shown in FIG. 6C, the amplitude of light passing through the photomask of FIGS. 6A and 6B is definite. In this case, the amplitude of light passing through the halftone layer 204 is small and opposite to the amplitude of light passing through the aperture 204a in terms of phase. Therefore, the light passed through the photomask of FIGS. 6A and 6B has rectangular characteristics as shown in FIG. 6C. As a result, as shown in FIG. 6D, the light intensity of the light pattern at the semiconductor wafer 107 loses the rectangular characteristics of FIG. 6C.

Figure 6D:
FIG. 6D is a graph showing light intensity characteristics of an image pattern obtained by the photomask of FIGS. 6A and 6B.

The light intensity characteristics as shown in FIG. 6D are sharp compared with those as shown in FIG. 3D. Therefore, the halftone type phase shift photomask of FIGS. 6A and 6B contributes to higher resolution and larger DOF.

In the half tone type phase shift photomask as illustrated in FIGS. 6A and 6B, note that, if this phase shift photomask is used as a reticle, one target exposure region of a semiconductor wafer exposed by this reticle is also irradiated by light beams for adjacent exposure regions of the semiconductor wafer, thus creating exposure defects in the semiconductor wafer i.e., loss of resist film thickness due to the multi-exposure. In order to avoid such exposure defects, a frame-type light screen layer is provided on the halftone layer (see: JP-A-6-282063).

The auxiliary pattern type phase shift photomask as illustrated in FIGS. 4A and 4B and the rim type phase shift photomask as illustrated in FIGS. 5A and 5B are complicated compared with the halftone type phase shift photomask as illustrated in FIGS. 6A and 6B. That is, it is difficult to manufacture and test the auxiliary pattern type phase shift photomask and the rim type phase shift photomask, to increase the manufacturing cost.

FIGS. 7A through 7F are simulated photoresist patterns obtained by the prior art non phase shift photomask of FIGS. 3A and 3B and obtained by the prior art halftone type phase shift photomask of FIGS. 6A and 6B. Here, the wavelength $\lambda$ of light is 365 nm, NA is 0.6, and the ring-shaped iris as illustrated in FIGS. 2A and 2B is used. Also, the transmittance T of the halftone layer 204 is 8 percent. That is, in the non phase shift photomask, if a defocus $\Delta F$ is changed, the fidelity is greatly changed. On the other hand, in the halftone type phase shift photomask, even if the defocus $\Delta F$ is changed, the fidelity is hardly changed. This means that the halftone type phase shift photomask is excellent in view of DOF.

In the halftone type phase shift photomask, as illustrated in FIGS. 7A through 7F, however, the longitudinal length of the photoresist pattern is reduced due to the optical proximity effect. This is disadvantageous compared with the non phase shift photomask.

Figure 8A:
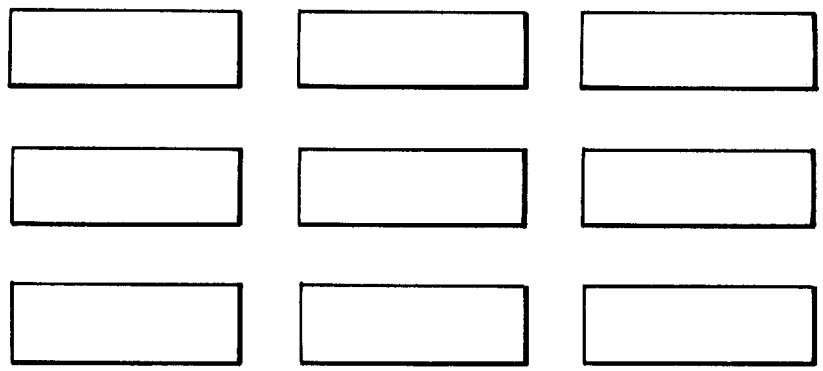
FIG. 8A is a pattern diagram of a conventional photomask for explaining the optical proximity effect.
Figure 8B:
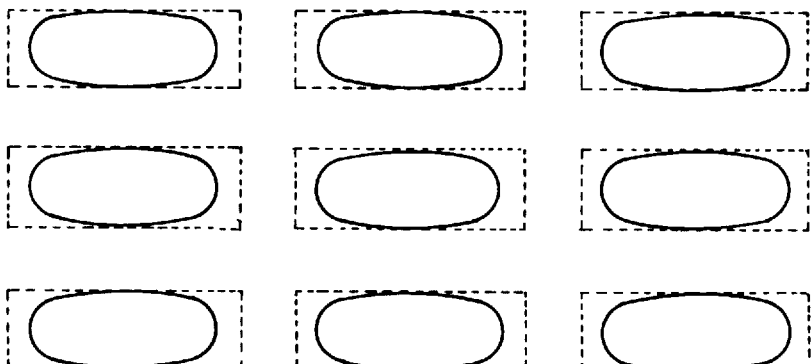
FIG. 8B is a pattern diagram of a photoresist layer obtained by the photomask of FIG. 8A.

The optical proximity effect is explained next with reference to FIGS. 8A and 8B. That is, when a photomask having rectangular patterns as illustrated in FIG. 8A is used, photoresist patterns as illustrated in FIG. 8B are obtained. In this case, the photoresist pattern of FIG. 8B is reduced compared with the patterns of the photomask of FIG. 8A due to the optical proximity effect. Particularly, the longitudinal length of each of the photoresist patterns is reduced, and the corners of the photoresist patterns are rounded. In order to diminish the optical proximity effect, OPC photomasks have been developed as illustrated in FIGS. 9A through 9D.

In FIG. 9A, which shows a mask bias correction method, the longitudinal length of a rectangular photomask pattern is made larger, thus compensating for the shortening of the longitudinal length of a photoresist pattern.

In FIG. 9B, a hammer head correction method, i.e., a partial mask bias method is shown. That is, the end portions of a photomask pattern are enlarged. Also, in FIG. 9C, a serif correction method is shown. That is, small protrusions are added to four ends of a photomask pattern. Both of the hammer head correction method and the serif correction method are helpful in compensating for the corner rounding.

Further, in FIG. 9D, auxiliary patterns are added at two ends of a photomask pattern, thus compensating for the shortening of the longitudinal length of a photoresist pattern.

In the OPC photomasks as illustrated in FIGS. 9B, 9C and 9D, the patterns are complex to increase manufacturing cost. That is, first, an amount of mask pattern data is increased. Second, when the serifs and the auxiliary patterns are too small, a size of an electron beam for depicting the patterns is changed, so that the depicting time is increased. Third, a batting error between a plurality of fields is increased, so that the patterns are deformed.

In the present invention, a new OPC technique is introduced into the halftone type phase shift photomask of FIGS. 6A and 6B.

Figure 10A:
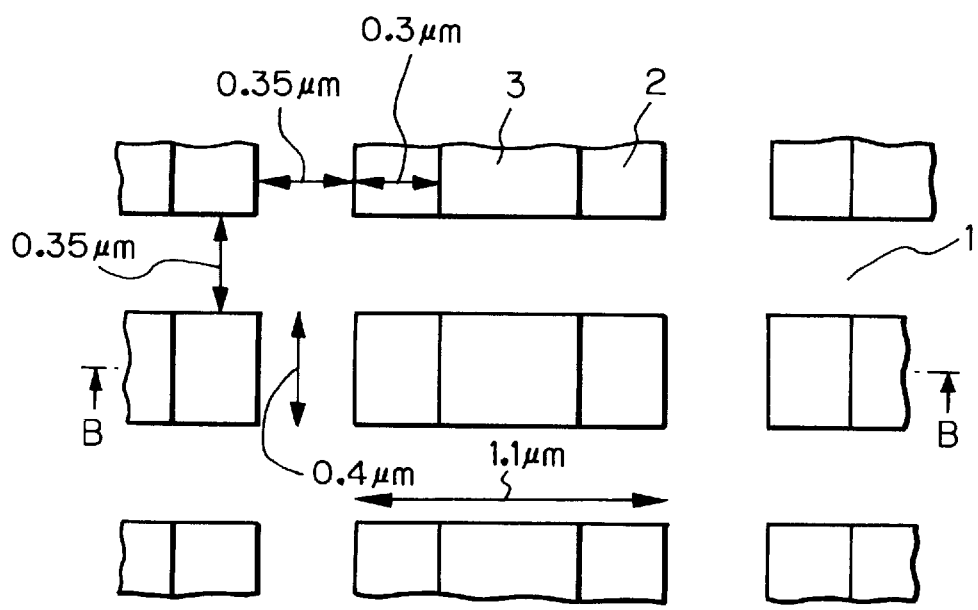
FIG. 10A is a plan view illustrating an embodiment of the OPC halftone type photomask according to the present invention.
Figure 10B:
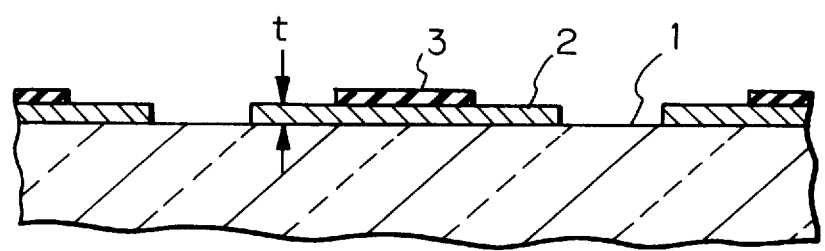
FIG. 10B is a cross-sectional view taken along the line B—B of FIG. 10A.

FIG. 10A is a plan view illustrating an embodiment of the OPC halftone type phase shift photomask according to the present invention, and FIG. 10B is a cross-sectional view taken along the line B—B of FIG. 10A. In FIGS. 10A and 10B, in the same way as in FIGS. 6A and 6B, reference numeral 1 designates a transparent substrate made of $SiO_2$ or the like, and 2 designates an halftone layer made of chrome nitride oxide or the like formed on the transparent substrate 1. In addition to the photomask of FIGS. 6A and 6B, an about 50 nm thick light screen layer 3 is formed on the halftone layer 2. Also, the thickness t of the halftone layer 2 satisfies the above-mentioned formula (2).

Further, each pattern of the halftone layer 2 is a rectangle having a long edge of 1.1 μm and a short edge of 0.4 μm.

In the OPC halftone type phase shift photomask, as illustrated in FIGS. 11A through 11F which show simulation results, the longitudinal length of the obtained photoresist pattern is hardly reduced. In addition, even if the defocus ΔF is changed from 0.2 to 1.0 μm, the longitudinal length of the obtained photoresist pattern is not reduced. Therefore, the shape of the obtained photoresist pattern on the condition that ΔF is 0.2 to 1.0 μm is about the same as that on the best condition that ΔF=0.

The design method of an OPC halftone type phase shift photomask according to the present invention will be explained next with reference to FIGS. 12A, 12B and 12C.

Figure 12A:
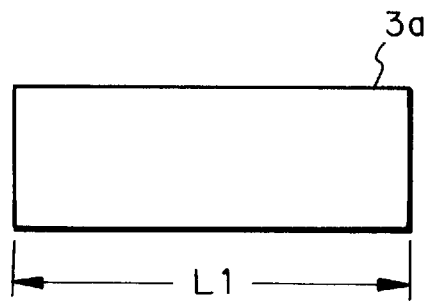
FIGS. 12A, 12B, 12C and 12D are diagram for explaining a design of the OPC halftone type photomask of FIGS. 10A and 10B.

First, referring to FIG. 12A, a photomask having a light screen layer 3a for defining a target photoresist pattern is considered. In this example, the light screen layer 3a is rectangular.

Figure 12B:
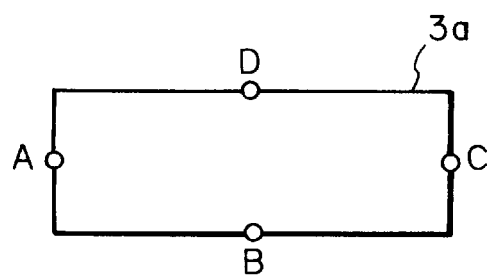

Next, referring to FIG. 12B, middle points A, B, C, D of edges of the light screen layer 3a are set. Then, light intensity is calculated for points of an obtained pattern at a target corresponding to the middle points A, B, C and D. Then, at least one middle point having a minimum light intensity is selected. For example, the light intensity is minimum such as 0.3 for the points B and D.

Figure 12C:
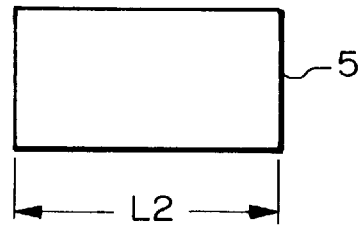

Next, referring to FIG. 12C, a two-dimensional light intensity distribution by the photomask of FIG. 12A at the target is calculated, and a photoresist pattern 5a on the target is calculated by slicing the two-dimensional light intensity distribution with the above-mentioned minimum value.

Figure 12D:
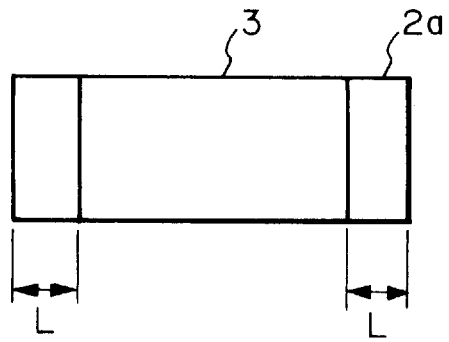

Finally, referring to FIG. 12D, the light screen layer 3a of FIG. 12A is compared with the obtained photoresist pattern of FIG. 12C. As a result, if a difference between the length L1 of the light screen layer 3a and the length L2 of the photoresist pattern 5a of FIG. 12C is larger than a definite value, a part of the light screen layer 3a is replaced with halftone layer patterns 2a having a length L. Note that the above-mentioned definite value is dependent upon aimed precision. For example, the precision of a dynamic random access memory (DRAM) is ±10 percent, and in this case, the above-mentioned definite value is ±10 percent ×¼×L1. The length L of the halftone layer patterns 2a is calculated in accordance with a graph as shown in FIG. 13.

Figure 13:
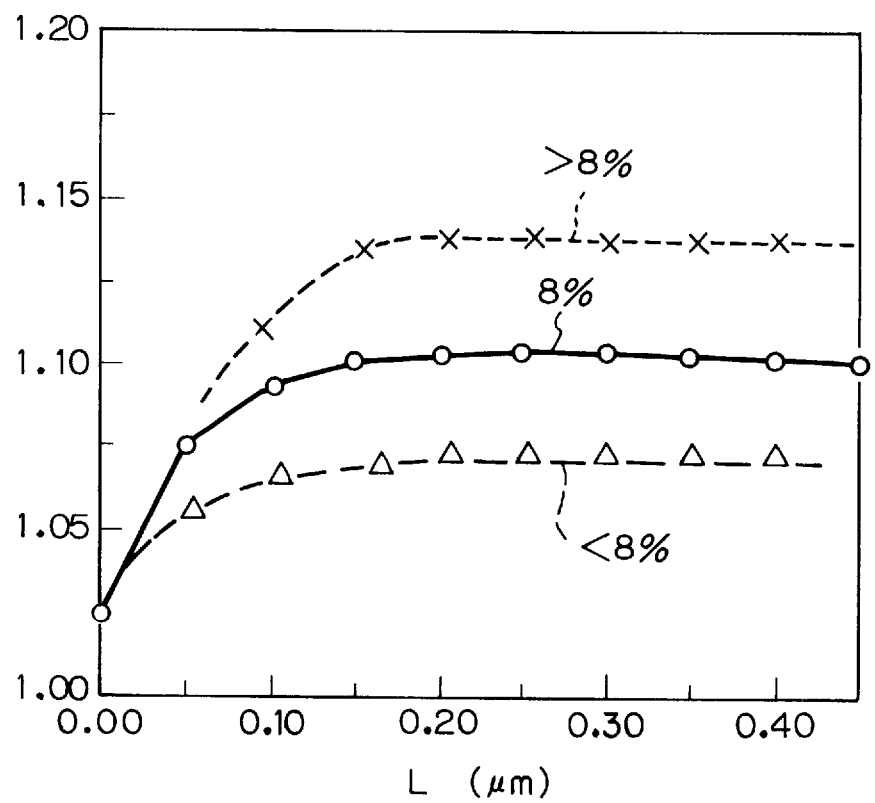
FIG. 13 is a graph showing the halftone length characteristics of FIGS. 12A and 12B.

In FIG. 13, note that the curve is dependent upon the transmittance of the halftone layer 2 which transmittance is 8 percent, for example. If the transmittance of the halftone layer 2 is increased, the larger difference (L1−L2)/2 can be compensated for.

Figure 14:
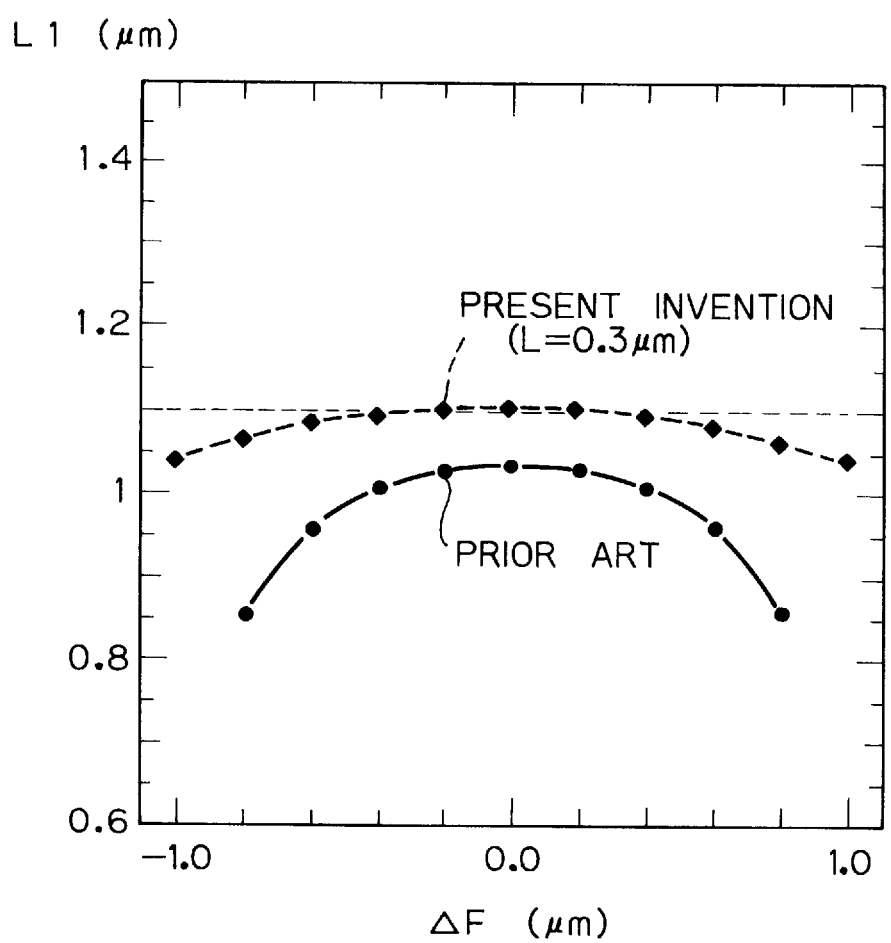
FIG. 14 is a graph showing the focus characteristics of the OPC halftone type photomask of FIGS. 10A and 10B.

In FIG. 14, which shows the focus characteristics of the photomask of FIGS. 10A and 10B, if the defocus ΔF is changed, the length L1 of the photoresist pattern is almost definite.

The manufacturing steps of the OPC halftone type phase shift photomask of FIGS. 10A and 10B are explained with reference to FIGS. 15A through 15H.

Figure 15A:
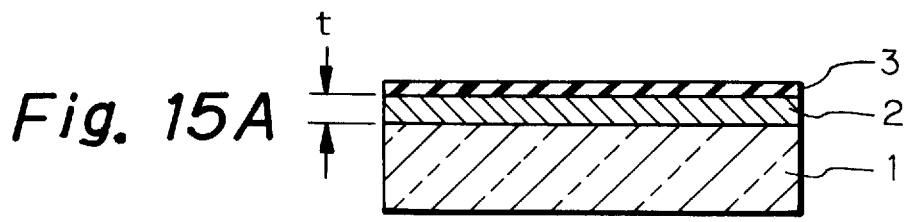
FIGS. 15A through 15H are cross-sectional views for explaining the manufacturing steps of the OPC halftone type photomask of FIGS. 10A and 10B.

First, referring to FIG. 15A, a thick halftone layer 2 made of CrON is formed on a transparent substrate 1 made of quartz ($SiO_2$). In this case, the transmittance of the halftone layer 2 is about 8 percent. Also, if λ=365 nm (i-line) and $n_2$=2.3, the thickness t of the halftone layer 2 is calculated by the formula (3):

$$t = 365 / 2 / (2.3 - 1)$$
$$= 140 \text{ nm}$$

Then, an about 50 nm thick light screen layer 3 made of RuO is formed on the halftone layer 2. In this case, the transmittance of the light screen layer 3 is 0.02 percent.

Figure 15B:
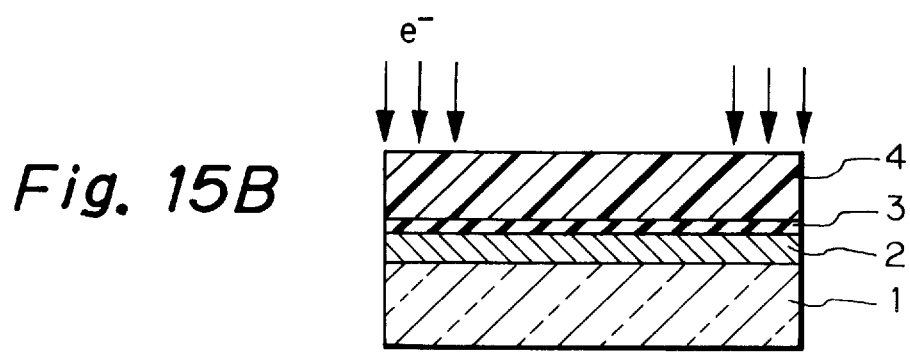
Figure 15C:
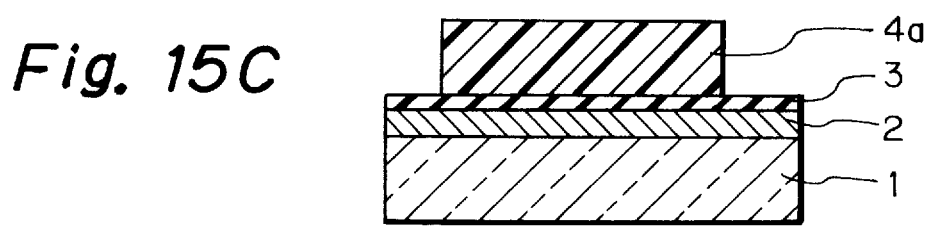

Next, referring to FIG. 15B, a photoresist layer 4 is coated on the light screen layer 3. Then, the photoresist layer 4 is patterned by an electron depiction process to obtain a photoresist pattern 4a as illustrated in FIG. 15C.

Figure 15D:
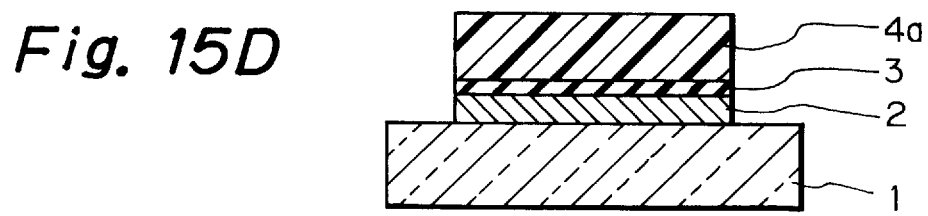

Next, referring to FIG. 15D, the light screen layer 3 is etched by a dry etching process of oxygen gas using the photoresist pattern 4a as a mask. Subsequently, the halftone layer 2 is etched by a dry etching process of chlorine gas using the photoresist pattern 4a as a mask. Then, the photoresist pattern 4a is removed.

Figure 15E:
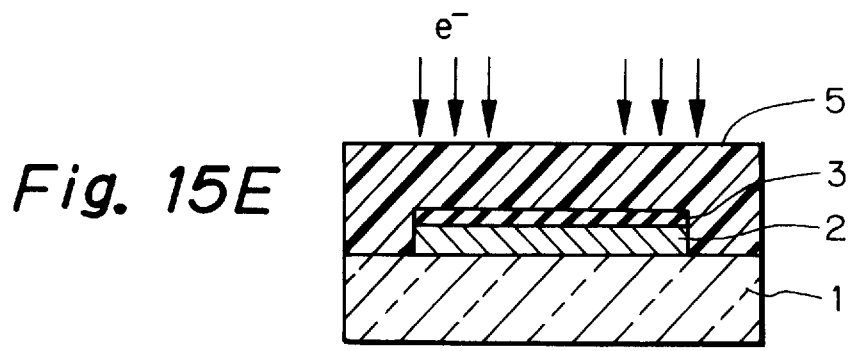
Figure 15F:
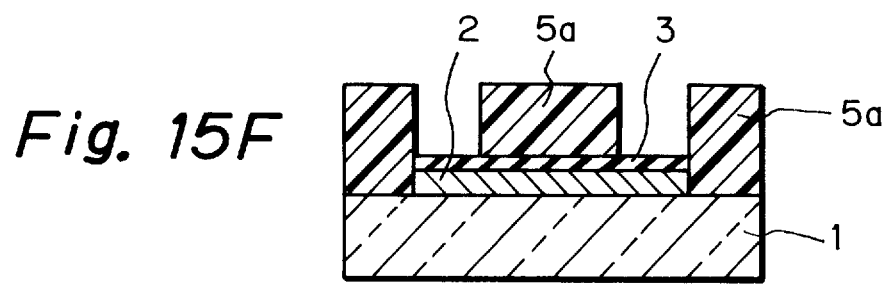

Next, referring to FIG. 15E, a photoresist layer 5 is coated on the entire surface. Then, the photoresist layer 5 is patterned by an electron depiction process to obtain a photoresist pattern 5a as illustrated in FIG. 15F.

Figure 15G:
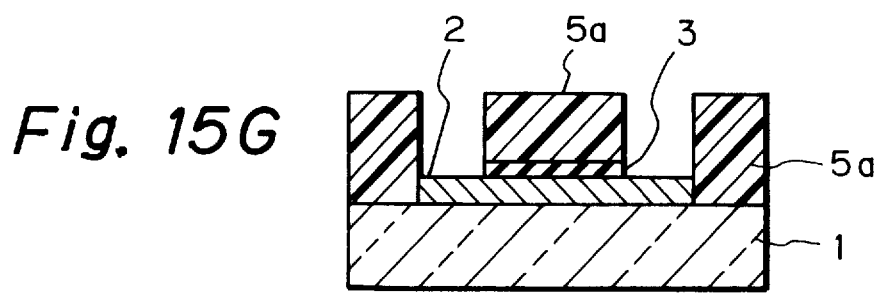
Figure 15H:
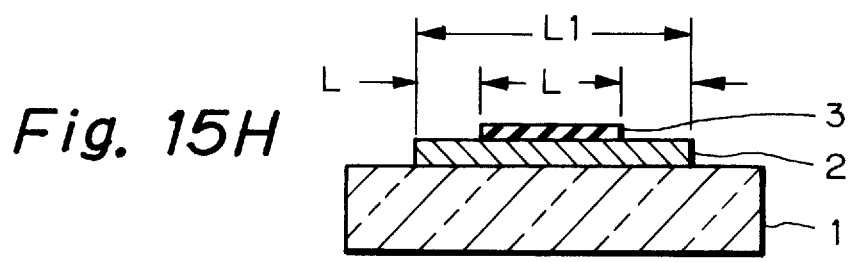

Next, referring to FIG. 15G, the light screen layer 3 is etched by a dry etching process of oxygen gas using the photoresist pattern 5a as a mask. Finally, referring to FIG. 15H, the photoresist pattern 5a is removed, to complete the photomask of FIGS. 10A and 10B.

According to the manufacturing steps as illustrated in FIGS. 15A through 15H, although two electron depiction and etching processes are required, the manufacturing time can be reduced as compared with the prior art OPC photomasks as illustrated in FIGS. 9B, 9C and 9D which are complex so as to require a large amount of electron depiction data.

Figure 16:
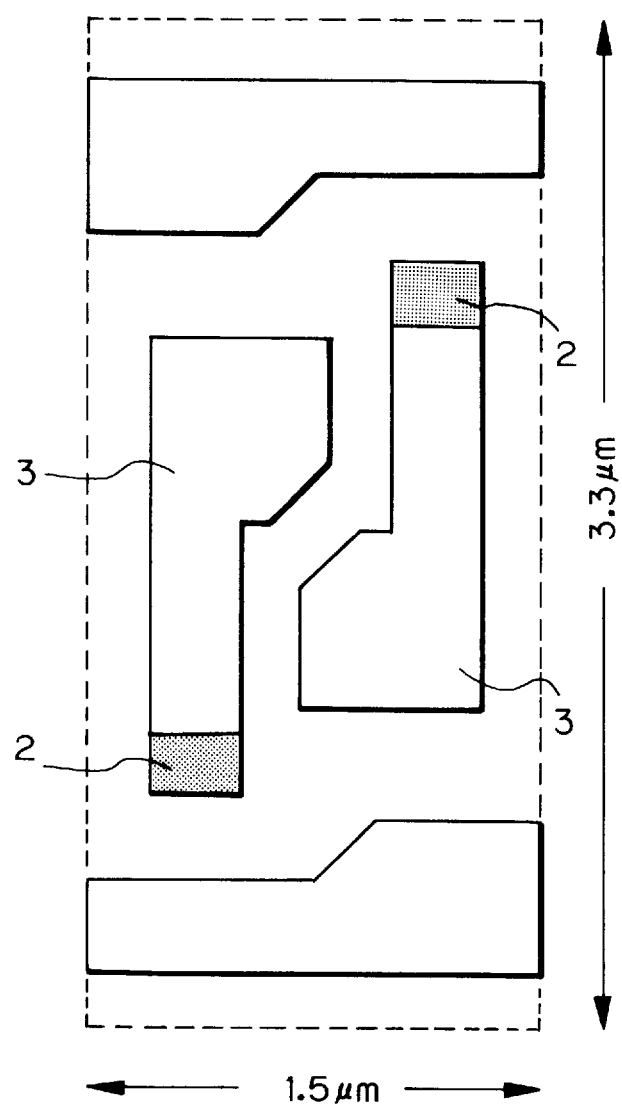
FIG. 16 is a plan view illustrating an example of the photomask to which the present invention is applied.

In FIG. 16, which illustrates a modification of the embodiment applied to a static random access memory (SRAM), an end of a light screen layer 3 is replaced by an halftone layer 2, so as to compensate for the reduction of the longitudinal length of a photoresist pattern obtained by a halftone type phase shift photomask. In this case, if the width of the light screen layer 3 is smaller than 0.35 µm, the end of the light screen layer 3 is replaced by the halftone layer 2.

As explained hereinabove, a halftone type phase shift photomask can have an excellent optical proximity correction function.

We claim:

1. A halftone type phase shift photomask comprising:

a transparent substrate;

a light screen pattern formed on a first area of said transparent substrate; and an halftone pattern formed on a second area of said transparent substrate, said second area being next to said first area, a phase difference between light passing through said halftone pattern and light not passing through said halftone pattern being 180°, and wherein said halftone pattern in said second area is of such a length as to correct an optical proximity effect in a photoresist pattern produced by passing light through said photomask, and wherein the length of said halftone pattern is such that a two-dimensional size of said photoresist pattern is not substantially reduced in relation to a photomask pattern when defocus changes within at least a range of between −1.0 µm and +1.0 µm inclusive.

2. The photomask as set forth in claim 1, wherein said first area is rectangular, and said second area is adjacent to a longitudinal end of said first area.

3. The photomask as set forth in claim 1, wherein said halftone pattern is formed between said first area of said transparent substrate and said light screen pattern.

4. The photomask as set forth in claim 1, wherein a thickness of said halftone pattern is $$(\lambda/2)/(n-1)$$

where λ is a wavelength of light; and n is a refractive index of said halftone pattern.

5. A method for manufacturing a halftone type phase shift photomask, comprising the steps of:

setting a provisional light screen layer area of a transparent substrate;

setting middle points of edges of said provisional light screen layer area;

calculating light intensity at points of an image pattern obtained by using said provisional light screen layer area, said points of said image pattern corresponding to said middle points;

selecting at least one of said points of said image pattern whose light intensity is minimum;

calculating a two-dimensional light intensity distribution based on said provisional light screen layer area;

slicing said two-dimensional light intensity distribution with the minimum light intensity to form a light screen layer area;

comparing said light screen layer area with said provisional light screen layer area;

replacing a part of said provisional light screen layer area with an halftone layer area in accordance with a difference between said light screen layer area and said provisional screen layer area;

forming a light screen layer in said light screen area; and forming an halftone layer in said halftone layer area.

6. A method for manufacturing a halftone type phase shift photomask, comprising the steps of:

setting a provisional rectangular light screen layer area of a transparent substrate;

setting middle points of edges of said provisional rectangular light screen layer area;

calculating light intensity at points of an image pattern obtained by using said provisional rectangular light screen layer area, said points of said image pattern corresponding to said middle points;

selecting at least one of said points of said image pattern whose light intensity is minimum;

calculating a two-dimensional light intensity distribution by said provisional rectangular light screen layer area;

slicing said two-dimensional light intensity distribution with the minimum light intensity to form a light screen layer area;

comparing a longitudinal length of said light screen layer area with a longitudinal length of said provisional rectangular light screen layer area;

replacing ends of said provisional rectangular light screen layer area with an halftone layer area in accordance with a difference in longitudinal length between said light screen layer area and said provisional rectangular screen layer area;

forming a light screen layer in said light screen area; and forming an halftone layer in said halftone layer area.

7. The photomask as set forth in claim 1, wherein the length of said halftone pattern corresponds to a value indicative of a length of said light screen pattern relative to a length of said photoresist pattern.

8. The photomask as set forth in claim 1, wherein the length of said halftone pattern is such that a length of said photoresist pattern is reduced at most approximately 0.5 µm over said range.

9. A halftone type phase shift photomask comprising:

a transparent substrate;

a light screen pattern formed on a first rectangular area of said transparent substrate; and a halftone pattern formed on a second rectangular area of said transparent substrate, said second rectangular area being next to said first rectangular area outside of only a short edge of said first rectangular area.

10. The photomask set forth in claim 9, wherein said second rectangular area has a width which does not exceed the short edge of said first rectangular area.

11. The photomask set forth in claim 10, further comprising:

a second halftone pattern formed on a third rectangular area of said transparent substrate, said third rectangular area being on next to said first rectangular area outside of only a second short edge of said first rectangular area, said third rectangular area having a width which does not exceed the second short edge of said first rectangular area.

12. A halftone type phase shift photomask comprising:

a transparent substrate;

a light screen layer formed on a first area of said transparent substrate; and a halftone pattern formed on a second area of said transparent substrate, said second area being next to said first area, a phase difference between light passing through said halftone pattern and light not passing through said halftone pattern being 180°, and wherein said halftone pattern extends from only one edge of said light screen layer so as not to overlap any other edge of said light screen layer and so that a two-dimensional size of a photoresist pattern produced by light passing through said photomask does not change substantially with changes in a length of said halftone pattern above a predetermined length.

* * * * *